(12) United States Patent
Kojima

(10) Patent No.: US 11,569,377 B2
(45) Date of Patent: Jan. 31, 2023

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Hideharu Kojima, Kanazawa Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/186,136

(22) Filed: Feb. 26, 2021

(65) Prior Publication Data

US 2022/0093787 A1    Mar. 24, 2022

(30) Foreign Application Priority Data

Sep. 18, 2020   (JP) .............................. JP2020-157832

(51) Int. Cl.
*H01L 29/78*   (2006.01)
*H01L 29/40*   (2006.01)
*H01L 29/786*  (2006.01)

(52) U.S. Cl.
CPC ........ *H01L 29/7813* (2013.01); *H01L 29/407* (2013.01); *H01L 29/78642* (2013.01)

(58) Field of Classification Search
CPC .............. H01L 29/407; H01L 29/7813; H01L 29/41741; H01L 29/7827; H01L 29/4236; H01L 27/2454; H01L 27/088
See application file for complete search history.

(56) References Cited

U.S. PATENT DOCUMENTS 9,263,534 B2   2/2016   Takano
10,121,888 B2  11/2018  Togami
(Continued)

FOREIGN PATENT DOCUMENTS

| JP | 6027511 B2 | 11/2016 |
| JP | 6197461 B2 | 9/2017 |
| JP | 2018-49974 A | 3/2018 |

*Primary Examiner* — Joseph C. Nicely
(74) *Attorney, Agent, or Firm* — Allen & Overy LLP

(57) ABSTRACT

A semiconductor device according to an embodiment includes: a first electrode; and a substrate including a first surface in contact with the first electrode and a second surface provided opposite to the first surface, the first surface including a first groove including a first length and a second length shorter than the first length, the first length in a first direction parallel to the first surface, the second length in a second direction parallel to the first surface, the second direction intersecting with the direction, wherein the substrate includes a semiconductor layer having first conductive type, a first semiconductor region provided between the semiconductor layer and the second surface, the first semiconductor region having second conductive type, a second semiconductor region provided between the first semiconductor region and the second surface, the second semiconductor region having first conductive type higher than an impurity concentration of the semiconductor layer, and a second electrode provided in a first trench, the second electrode being provided opposite to the first semiconductor region via a first insulating film, the first trench reaching the semiconductor layer from the second surface, the first trench extending in the second direction.

15 Claims, 16 Drawing Sheets

(56) References Cited

U.S. PATENT DOCUMENTS

| | | | |
|---|---|---|---|
| 2009/0256196 A1* | 10/2009 | Wang | H01L 29/7809 257/334 |
| 2016/0189955 A1 | 6/2016 | Horii et al. | |
| 2018/0090611 A1* | 3/2018 | Togami | H01L 27/0207 |
| 2022/0158009 A1* | 5/2022 | Jin | H01L 31/02167 |

* cited by examiner

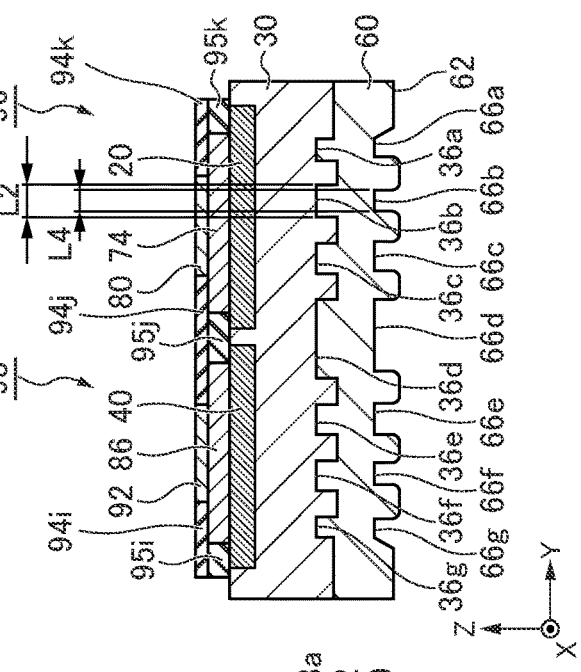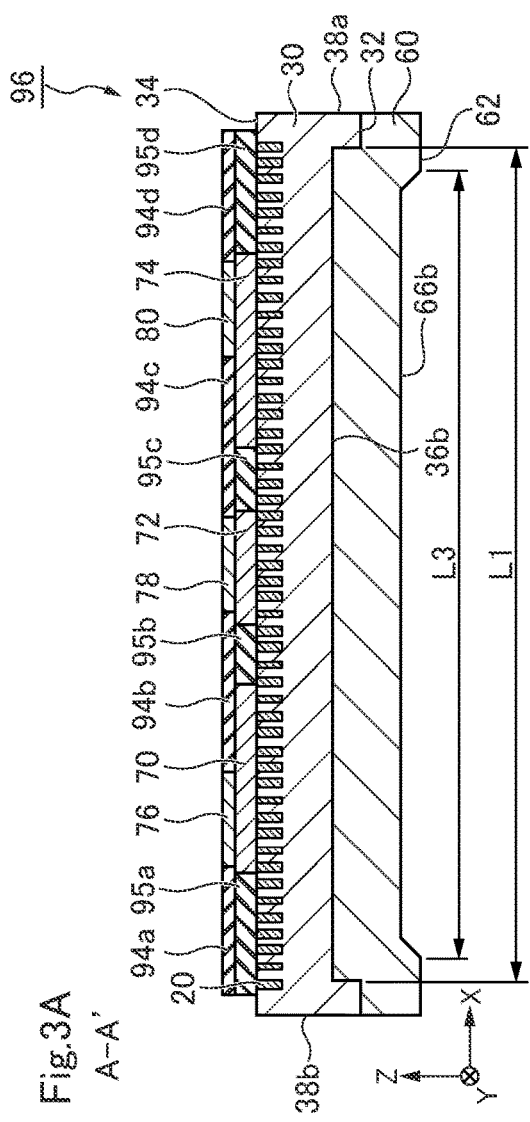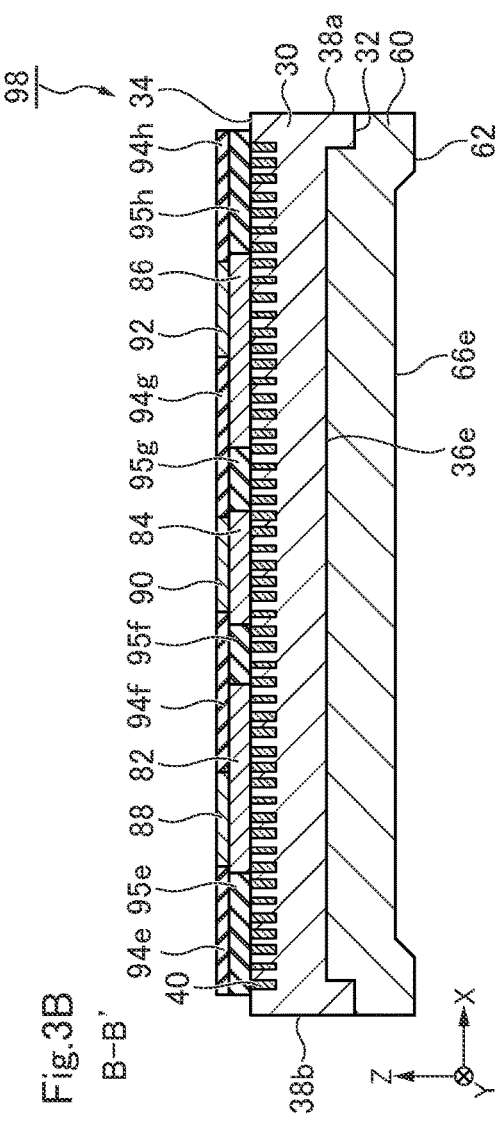

E-E'

SEMICONDUCTOR DEVICE

CROSS-REFERENCE TO RELATED APPLICATION

This application is based upon and claims the benefit of priority from Japanese Patent Application No. 2020-157832, filed on Sep. 18, 2020, the entire contents of which are incorporated herein by reference.

FIELD

Embodiments described herein relate generally to a semiconductor device.

BACKGROUND

Semiconductor devices, such as a MOSFET (Metal Oxide Semiconductor Field Effect Transistor), are used for power conversion, for example. Such a semiconductor device desirably has a high yield.

BRIEF DESCRIPTION OF THE DRAWINGS

FIGS. 3A to 3C are schematic cross sectional views of the semiconductor device according to the first embodiment;

DETAILED DESCRIPTION

Figure 1:
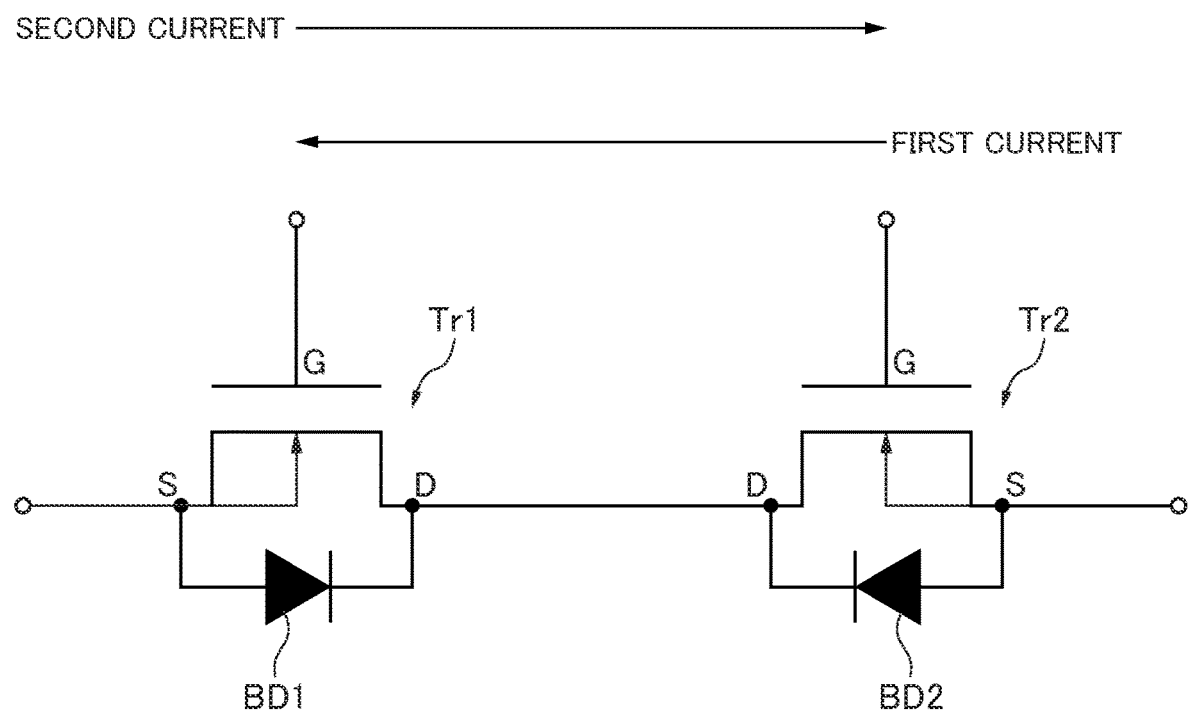
FIG. 1 is a schematic electric circuit diagram of a semiconductor device of a first embodiment.

A semiconductor device according to an embodiment includes: a first electrode; and a substrate including a first surface in contact with the first electrode and a second surface provided opposite to the first surface, the first surface including a first groove including a first length and a second length shorter than the first length, the first length in a first direction parallel to the first surface, the second length in a second direction parallel to the first surface, the second direction intersecting with the first direction, wherein the substrate includes a semiconductor layer having first conductive type, a first semiconductor region provided between the semiconductor layer and the second surface, the first semiconductor region having second conductive type, a second semiconductor region provided between the first semiconductor region and the second surface, the second semiconductor region having first conductive type higher than an impurity concentration of the semiconductor layer, and a second electrode provided in a first trench, the second electrode being provided opposite to the first semiconductor region via a first insulating film, the first trench reaching the semiconductor layer from the second surface, the first trench extending in the second direction.

In the following, embodiments of the present disclosure will be described with reference to the drawings. It should be noted that in the following description, the same members and any other components are designated with the same reference signs, and the description of the members and any other components, which are once described, is appropriately omitted.

In the present specification, in order to show the positional relationship between components and the like, the upward direction in the drawings is described as "upper", and the downward direction in the drawings is described as "lower". In the present specification, the concepts of "upper" and "lower" are necessarily the terms expressing the relationship between the orientations of gravity.

In the following, the case will be described as an example in which first conductive type is an n type and second conductive type is a p type.

In the following description, notations, $n^+$, n, $n^-$, $p^+$, p, and $p^-$, express relative levels of impurity concentrations in these conductive types. That is, the impurity concentration of the $n^+$ type is relatively higher than the impurity concentration of the n type, and the impurity concentration of the $n^-$ type is relatively lower than the impurity concentration of the n type. The impurity concentration of the type is relatively higher than the impurity concentration of the p type, and the impurity concentration of the $p^-$ type is relatively lower than the impurity concentration of the p type. It should be noted that the $n^+$ type and the $n^-$ type are sometimes simply written in the n type, and the $p^+$ type and the $p^-$ type are sometimes simply written in the p type.

First Embodiment

A semiconductor device according to the present embodiment includes: a first electrode; and a substrate including a first surface in contact with the first electrode and a second surface provided opposite to the first surface, the first surface including a first groove including a first length and a second length shorter than the first length, the first length in a first direction parallel to the first surface, the second length in a second direction parallel to the first surface, the second direction intersecting with the first direction, wherein the substrate includes a semiconductor layer having first conductive type, a first semiconductor region provided between the semiconductor layer and the second surface, the first semiconductor region having second conductive type, a second semiconductor region provided between the first semiconductor region and the second surface, the second semiconductor region having first conductive type higher than an impurity concentration of the semiconductor layer, and a second electrode provided in a first trench, the second electrode being provided opposite to the first semiconductor region via a first insulating film, the first trench reaching the semiconductor layer from the second surface, the first trench extending in the second direction.

In the semiconductor device according to the present embodiment, the substrate further includes a third semiconductor region provided between the semiconductor layer and the second surface, the third semiconductor region having second conductive type, a fourth semiconductor region provided between the third semiconductor region and the second surface, the fourth semiconductor region having the first conductive type higher than an impurity concentration of the semiconductor layer, and a third electrode provided in a second trench, the third electrode being provided opposite to the third semiconductor region via a second insulating film, the second trench reaching the semiconductor layer from the second surface, the second trench extending in the second direction, the substrate includes a first region and a second region, the first region includes the first semiconductor region, the second semiconductor region, and the second electrode, the second region is provided adjacent to the first region in the second direction, and the second region includes the third semiconductor region, the fourth semiconductor region, and the third electrode, and the first groove extends from the first region to the second region.

FIG. 1 is a schematic electric circuit diagram of a semiconductor device 100 according to the present embodiment. The electric circuit of the semiconductor device 100 according to the present embodiment is an electric circuit in which the drain of a first transistor Tr1 is electrically connected to the drain of a second transistor Tr2. For example, the circuit of the semiconductor device 100 is an electric circuit used for charging and discharging a rechargeable secondary battery. For example, in FIG. 1, a first electric current carried from right to left is a discharge current from a rechargeable secondary battery. For example, in FIG. 1, a second current carried from left to right is a charge current to the rechargeable secondary battery. In this manner, the electric circuit of the semiconductor device 100 can carry the first electric current and the second current in opposite directions.

Here, the case is considered in which only the first transistor Tr1 is provided and the second transistor Tr2 is not provided. In this case, even though the first transistor Tr1 is turned off to stop the flow of the second current, the second current is carried through a body diode BD1 of the first transistor Tr1.

The case is considered in which only the second transistor Tr2 is provided and the first transistor Tr1 is not provided. In this case, even though the second transistor Tr2 is turned off to stop the flow of the first electric current, the first electric current is carried through a body diode BD2 of the second transistor Tr2.

Therefore, in the semiconductor device 100, the drain of the first transistor Tr1 is electrically connected to the drain of the second transistor Tr2. By such connection, the cathode of the body diode BD1 is electrically connected to the cathode of the body diode BD2. Here, it is considered that the first transistor Tr1 and the second transistor Tr2 are turned off to stop the second current. In this case, even though the second current is carried via the body diode BD1 of the first transistor Tr1, the second current is not carried because the cathode of the body diode BD2 is electrically connected to the cathode of the body diode BD1. It is considered that the first transistor Tr1 and the second transistor Tr2 are turned off to stop the first electric current. In this case, even though the first electric current is carried via the body diode BD2 of the second transistor Tr2, the first electric current is not carried because the cathode of the body diode BD1 is electrically connected to the cathode of the body diode BD2. Thus, in the semiconductor device 100, the first electric current and the second current can be controlled.

Figure 2:
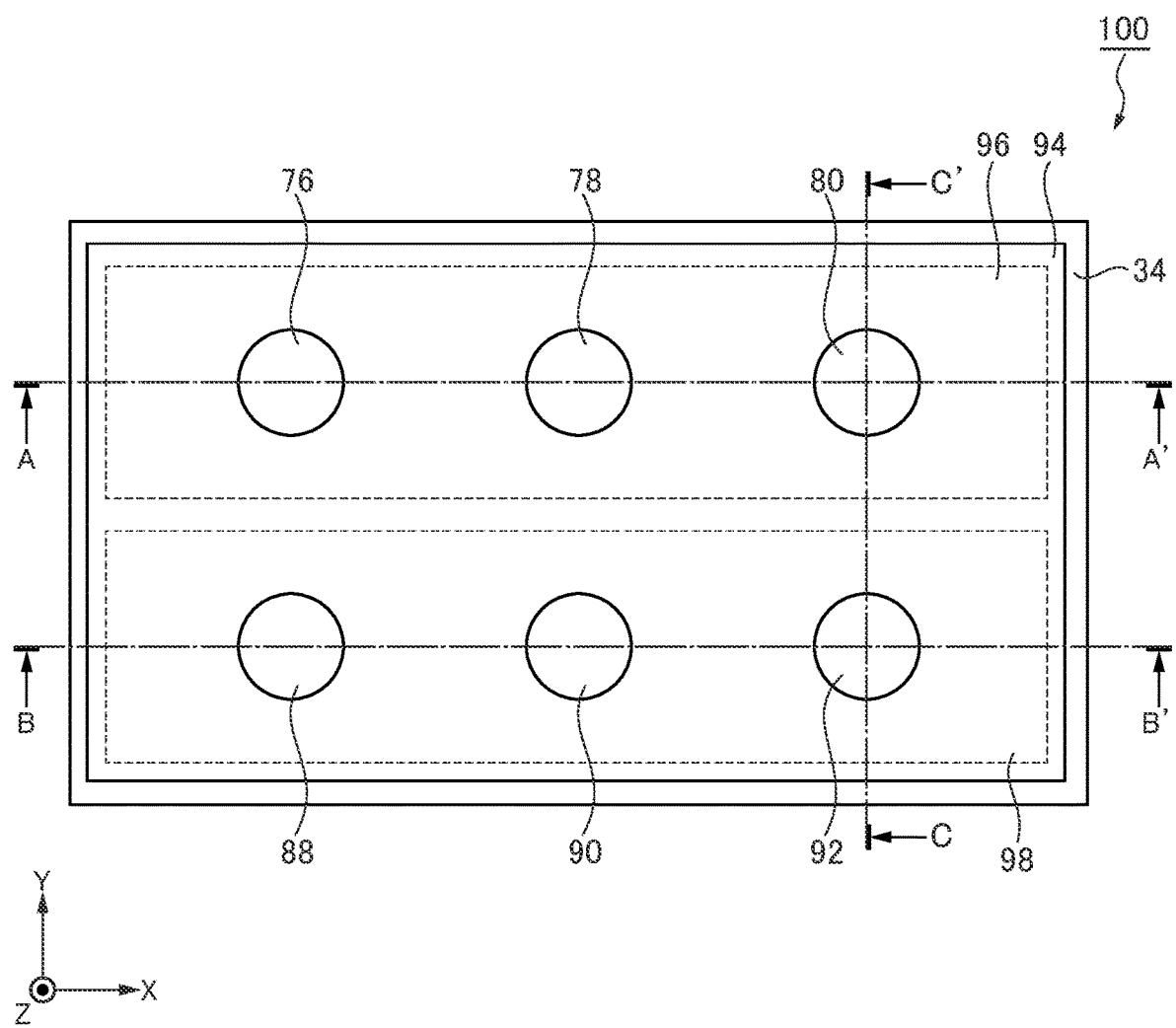
FIG. 2 is a schematic top view of the semiconductor device of the first embodiment.
Figure 4:
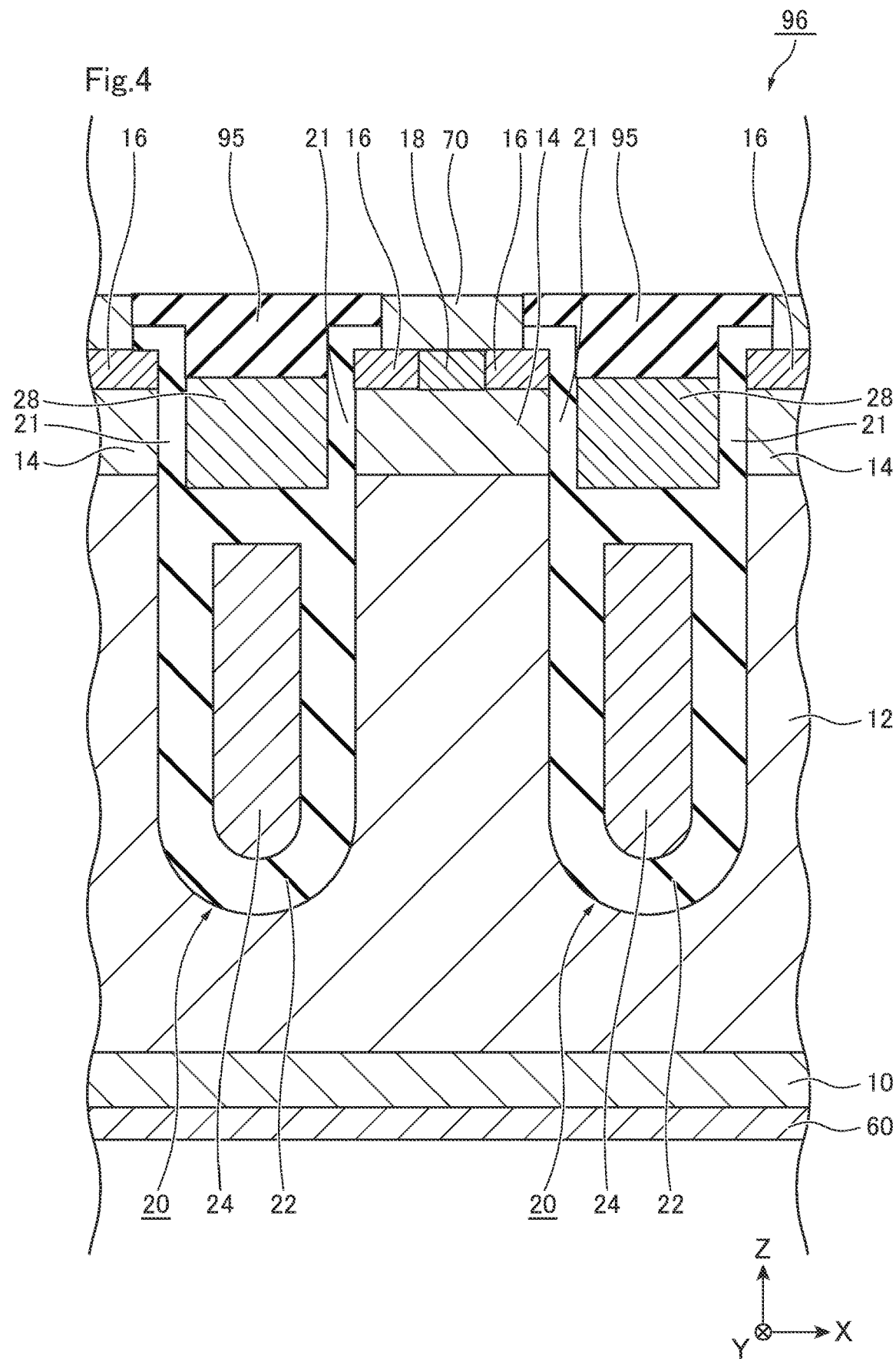
FIG. 4 is a schematic cross sectional view of the main components of the semiconductor device according to the first embodiment.
Figure 5:
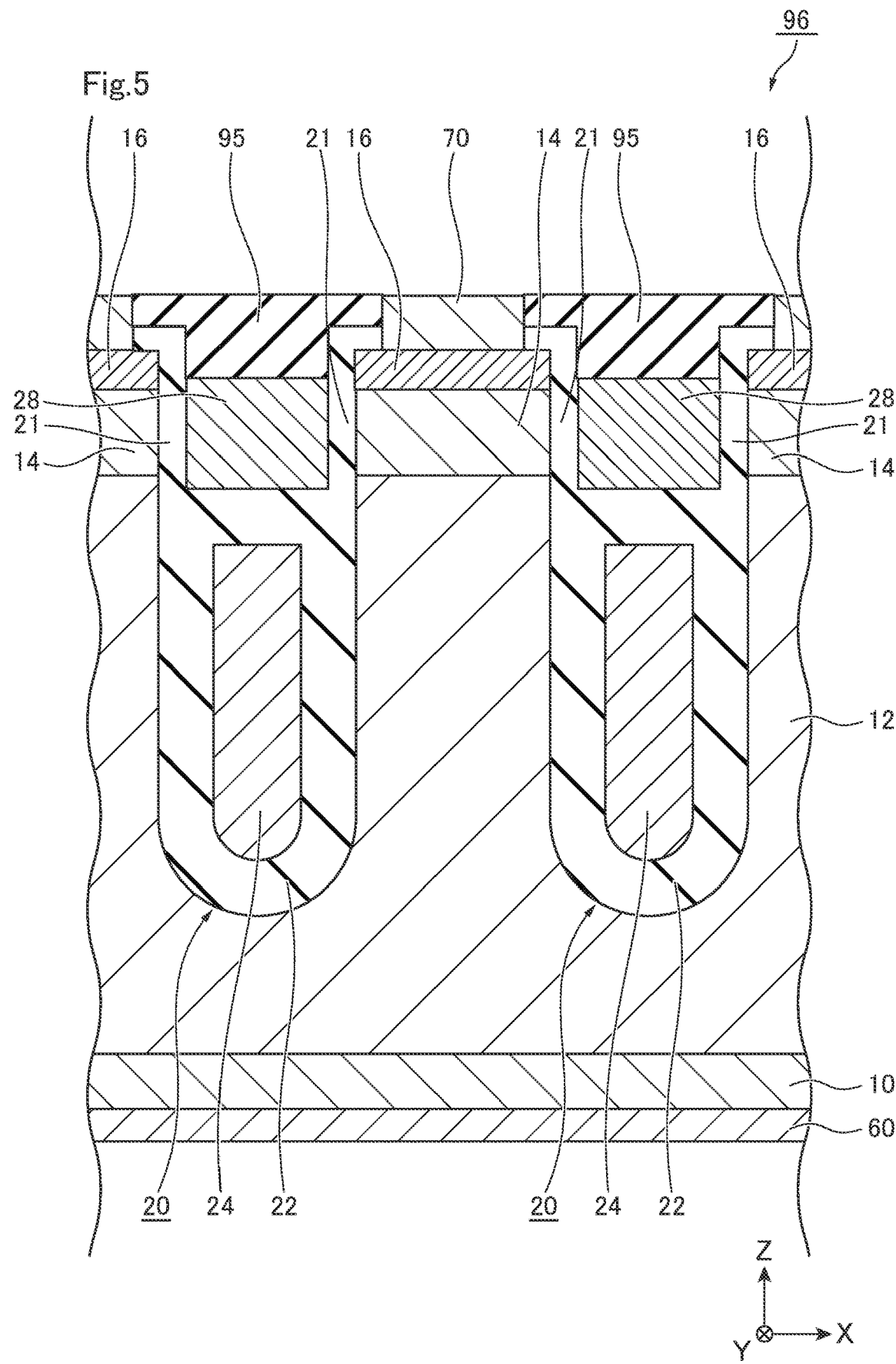
FIG. 5 is a schematic cross sectional view of another example of the main components of the semiconductor device according to the first embodiment.
Figure 6:
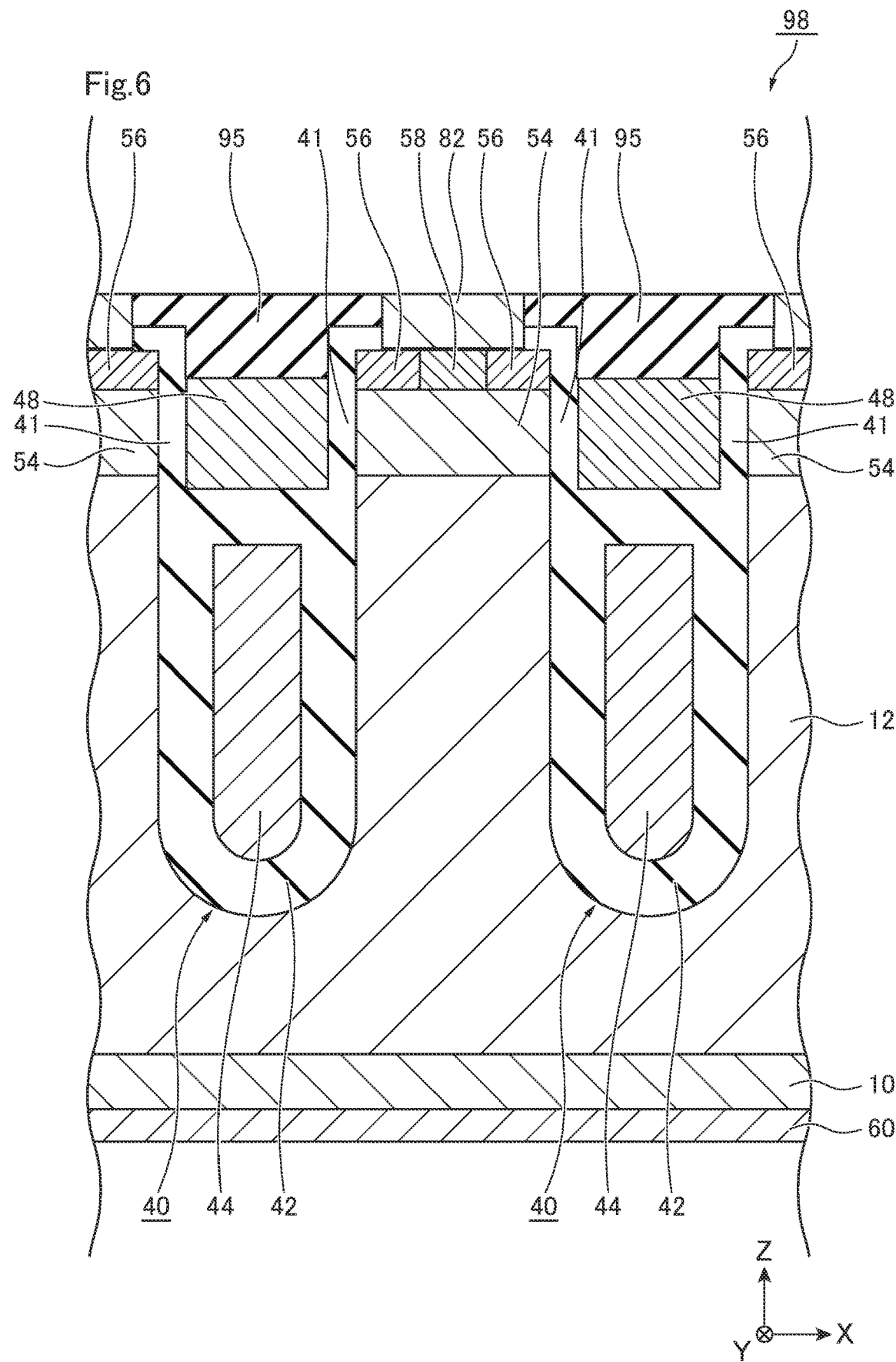
FIG. 6 is a schematic cross sectional view of the main components of the semiconductor device according to the first embodiment.
Figure 7:
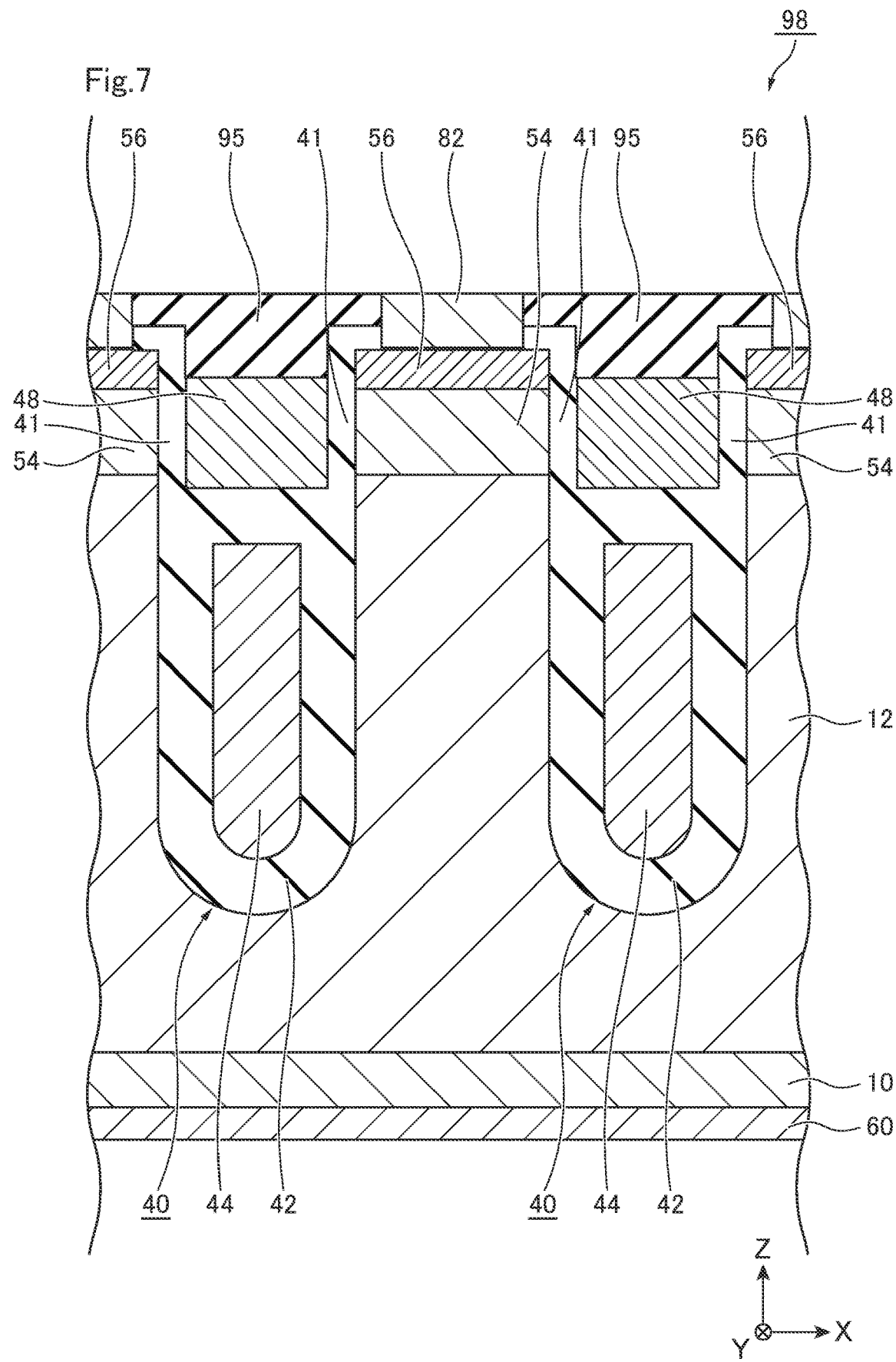
FIG. 7 is a schematic cross sectional view of another example of the main components of the semiconductor device according to the first embodiment.

FIG. 2 is a schematic top view of the semiconductor device 100 according to the present embodiment. FIGS. 3A to 3C are a schematic cross sectional views of the semiconductor device 100 according to the present embodiment. FIG. 4 is a schematic cross sectional view of the main components of the semiconductor device 100 according to the present embodiment. FIG. 5 is a schematic cross sectional view of another example of the main components of the semiconductor device 100 according to the present embodiment. FIG. 6 is a schematic cross sectional view of the main components of the semiconductor device 100 according to the present embodiment. FIG. 7 is a schematic cross sectional view of another example of the main components of the semiconductor device 100 according to the present embodiment.

The semiconductor device 100 according to the present embodiment will be described with reference to FIGS. 2, 3A to 3C, 4, 5, 6, and 7.

The semiconductor device 100 includes a substrate 30. The substrate 30 includes a first surface 32, a second surface 34, and a side surface 38. For example, in FIGS. 3A and 3B, a side surface 38a and a side surface 38b are provided.

Here, an X-direction (an example of a first direction), a Y-direction vertically intersecting with the X-direction (an example of a second direction), and a Z-direction vertically intersecting with the X-direction and the Y-direction (an example of a third direction) are defined. The first surface 32 and the second surface 34 are surfaces provided in parallel with the X-Y plane in parallel with the X-direction and the Y-direction.

The semiconductor device 100 is provided with a first region 96 and a second region 98 (FIG. 2). The first region 96 and the second region 98 are rectangular regions arranged in the Y-direction, for example, as shown in FIG. 2. For example, the first transistor Tr1 (FIG. 1) is provided in the first region 96, and the second transistor Tr2 (FIG. 1) is provided in the second region 98. Although the first transistor Tr1 and the second transistor Tr2 are MOSFETs, for example, the first transistor Tr1 and the second transistor Tr2 are not limited to MOSFETs.

FIG. 3A is a schematic cross sectional view of a surface in parallel with the X-Z plane along A-A' line in the first region 96. FIG. 3B is a schematic cross sectional view of a surface in parallel with the X-Z plane along B-B' line in the second region 98. FIG. 3C is a schematic cross sectional view of a surface in parallel with the Y-Z plane along C-C' line across the first region 96 and the second region 98.

A drain electrode (an example of a first electrode) 60 is provided below the substrate 30, and the drain electrode 60 is in contact with the first surface 32. In other words, the substrate 30 is provided on the drain electrode 60. The drain electrode 60 functions as the drain electrode shared by the first transistor Tr1 and the second transistor Tr2.

The first surface 32 of the substrate 30 includes a groove (an example of a first groove) 36 including a length $L_2$ in the Y-direction shorter than a length $L_1$ in the X-direction. In FIG. 3C, a groove 36a, a groove 36b, a groove 36c, a groove 36d, a groove 36e, a groove 36f, and a groove 36g are shown. As shown in FIGS. 3A and 3B, the groove 36b and the groove 36e do not penetrate the side surface 38 (the side surface 38a and the side surface 38b) of the substrate 30. Similarly, the other grooves, the groove 36a, the groove 36c, the groove 36d, the groove 36f, and the groove 36g, do not penetrate the side surface 38 of the substrate 30 as well. In the case in which a plurality of the groove 36 is provided, preferably, all the grooves 36 do not penetrate the side surface 38 of the substrate 30. The groove 36d extends from the first region 96 to the second region 98. In other words, the groove 36d straddles the first region 96 and the second region 98.

Preferably, the ratio of the volume occupied by the groove 36 to the substrate 30 is 5% or more 20% or less.

The drain electrode 60 includes a groove 66 (an example of a second groove), the groove 66 corresponding to the groove 36 by covering the groove 36 on the first surface 32. In other words, a bottom surface 62 of the drain electrode 60 includes the groove (an example of the second groove) 66 below the groove 36, and the groove 66 includes a length $L_4$ in the Y-direction shorter than a length $L_3$ in the X-direction. In other words, the groove 36 and the groove 66 overlaps each other in the Z-direction. In FIG. 3C, a groove 66a, a groove 66b, a groove 66c, a groove 66d, a groove 66e, a groove 66f, and a groove 66g are shown. Here, $L_3<L_1$, and $L_4<L_2$.

FIG. 4 is a schematic cross sectional view of the main components of the semiconductor device 100 in the first region 96.

A drain layer 10 is provided on the drain electrode 60. The drain layer 10 is a semiconductor material of an $n^+$ type, for example.

A drift layer (an example of a semiconductor layer) 12 is provided on the drain layer 10. The drift layer 12 is a layer functioning as the drift layer of the MOSFET. The drift layer 12 is a semiconductor material of an $n^-$ type, for example. The impurity concentration of an n type in the drift layer 12 is lower than the impurity concentration of an n type in the drain layer 10.

A base region (an example of a first semiconductor region) 14 is provided on the drift layer 12. The base region 14 functions as the base of the MOSFET. The base region 14 is a region in which a channel is formed in the case in which a voltage is applied to a first gate electrode 28, described later, and a carrier is allowed to be carried across the drain layer 10 and a source region 16, described later. The base region 14 is a semiconductor material of a p type, for example.

The source region (an example of a second semiconductor region) 16 is provided on the base region 14. The source region 16 is a region functioning as the source of the MOSFET. In the case in which an appropriate voltage is applied to the first gate electrode 28, described later, a carrier is carried across the source region 16 and the drain layer 10. The source region 16 is a semiconductor material of an $n^+$ type, for example. The impurity concentration of an n type in the source region 16 is higher than the impurity concentration of an n type in the drift layer 12.

A contact region 18 is provided on the base region 14, and the contact region 18 is electrically connected to the base region 14 and the source region 16. The contact region 18 is provided for improving the electrical contact with the base region 14 and the source region 16, and a source metal 70, described later. The contact region 18 is a semiconductor material of a $p^+$ type, for example.

A first trench 20 is provided so as to reach the drift layer 12 from a surface of the source region 16. The first trench 20 extends in the depth of the drawing (in the Y-direction).

A third insulating film 22 is provided in the first trench 20. For example, the third insulating film 22 is provided so as to cover a first field plate electrode 24, described later. For example, the third insulating film 22 is provided between the first field plate electrode 24 and the first gate electrode 28. However, the form of the third insulating film 22 is not limited to this. Although the third insulating film 22 includes $SiO_x$ (silicon oxide), materials are not limited to this.

A first insulating film 21 is provided between the base region 14 and the first gate electrode 28 and between an interlayer insulating film 95, described later, and the source region 16, on the third insulating film 22 in the first trench 20. Although the first in film 21 includes $SiO_x$ (silicon oxide), materials are not limited to this.

The first field plate electrode 24 is provided in the first trench 20 in the drift layer 12, and the first field plate electrode 24 is provided opposite to the drift layer 12 via the third insulating film 22. For example, the first field plate electrode 24 is provided side by side with the drift layer 12. The first field plate electrode 24 is provided to promote the extension of the depleted layer from the base region 14 to the drift layer 12, for example, and to increase withstand voltage. It should be noted that the first field plate electrode 24 does not necessarily have to be provided.

The first gate electrode (an example of a second electrode) 28 is located above the first field plate electrode 24, and the first gate electrode 28 is provided between a plurality of base regions 14 with the first insulating film 21 interposed. The first gate electrode 28 is an electrode functioning as the gate of the MOSFET.

The interlayer insulating film 95 is provided above the source region 16, on the first gate electrode 28, and on the first insulating film 21. Although the interlayer insulating film 95 includes $SiO_x$, for example, materials are not limited to this.

The source metal 70 and a source metal 74 (FIG. 3A) are provided on the source region 16 and the contact region 18, and the source metal 70 and the source metal 74 are electrically connected to the source region 16 and the contact region 18.

FIG. 5 is a schematic cross sectional view of another example of the main components of the semiconductor device 100 in the first region 96. The contact region 18 does not necessarily have to be provided.

FIG. 6 is a schematic cross sectional view of the main components of the semiconductor device 100 in the second region 98. For example, the drain electrode 60, the drain layer 10, and the drift layer 12 are provided in common with the first region 96.

On the other hand, in the second region 98, a base region (an example of a third semiconductor region) 54 is provided on the drift layer 12. On the base region 54, a source region (an example of a fourth semiconductor region) 56 is provided. On the base region 54, a contact region 58 is provided. In other words, the base region, the source region, and the contact region are separately provided in the first region 96 and in the second region 98.

Instead of the first trench 20, a second trench 40 extending in the depth of the drawing (in the Y-direction) is provided.

Instead of the third insulating film 22, a fourth insulating film 42 is provided. Instead of the first insulating film 21, a second insulating film 41 is provided. Instead of the first field plate electrode 24, a second field plate electrode 44 is provided. It should be noted that the second field plate electrode 44 does not necessarily have to be provided. Instead of the first gate electrode 28, a second gate electrode (an example of a third electrode) 48 is provided. Instead of the source metal 70 and the source metal 74, a source metal 82 and a source metal 86 (FIG. 3A) are provided.

FIG. 7 is a schematic cross sectional view of another example of the main components of the semiconductor device 100 in the second region 98. The contact region 58 does not necessarily have to be provided.

It should be noted that the configuration in the first region 96 and the configuration in the second region 98 are not limited to the relationships above.

A gate metal 72 is provided between the source metal 70 and the source metal 74 in the first region 96.

A gate metal 84 is provided between the source metal. 82 and the source metal 86 in the second region 98.

The gate metal 72 is isolated from the source metal 70 by an interlayer insulating film 95$b$. The gate metal 72 is isolated from. the source metal 74 by an interlayer insulating film 95$c$. The gate metal 84 is isolated from the source metal 82 by an interlayer insulating film 95$f$. The gate metal 84 is isolated from the source metal 86 by an interlayer insulating film 95$g$.

The source metal 74 is isolated from the source metal 86 by an interlayer insulating film 95$j$. It should be noted that the source metal 70 is isolated from the source metal 82, and the gate metal 72 is isolated from the gate metal 84 similarly by the interlayer insulating film 95.

Figure 8:
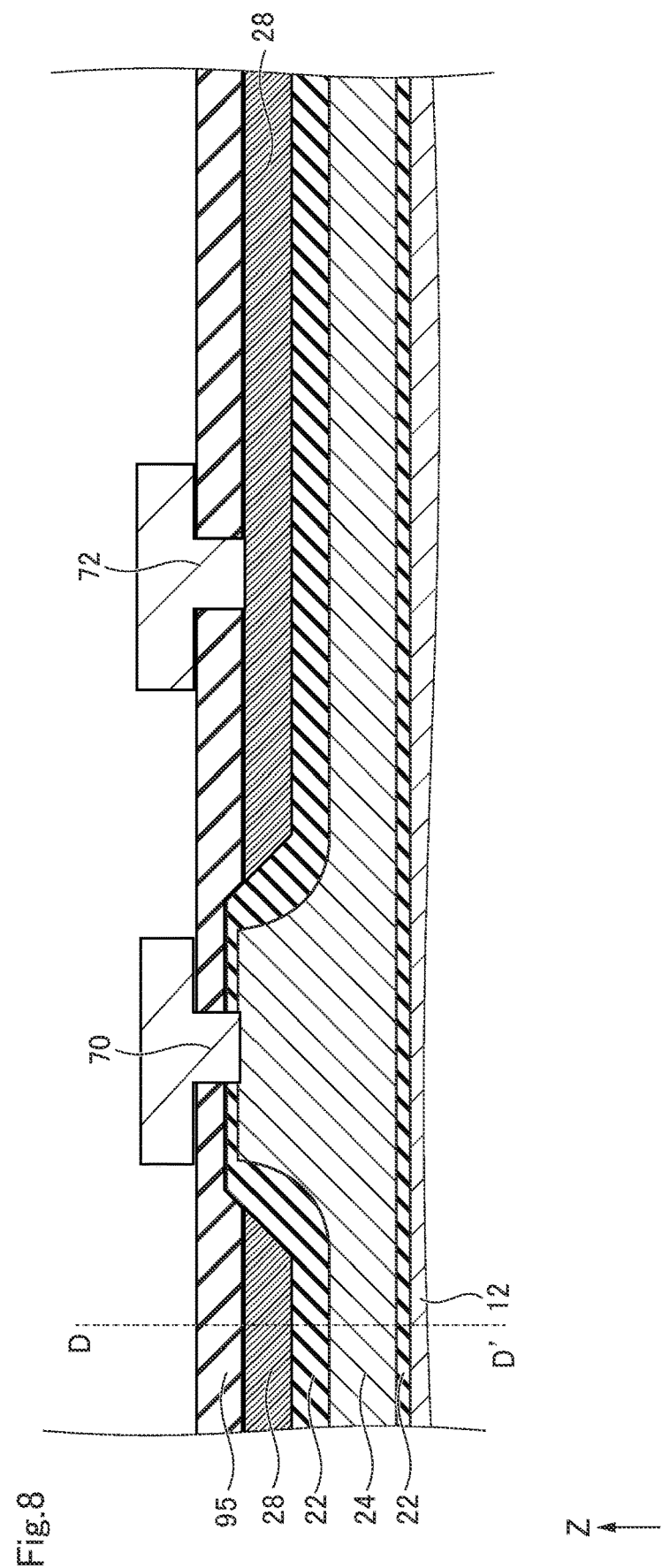
FIG. 8 is a schematic cross sectional view of the main components of the semiconductor device according to the first embodiment.

FIG. 8 is a schematic cross sectional view of the main components of the semiconductor device according to the first embodiment 100. FIG. 8 is a schematic cross sectional view showing an example of a method of connecting the first field plate electrode 24 to the source metal 70 and an example of a method of connecting the first gate electrode 28 to the gate metal 72. For example, the schematic cross sectional views from FIGS. 4 to 7 correspond to schematic cross sectional views in a cross section taken along line D-D' in FIG. 8.

The first field plate electrode 24 includes a portion extending in the Z-direction. With the use of such a portion extending in the Z-direction, the first field plate electrode 24 is electrically connected to the source metal 70 via a contact hole provided in the interlayer insulating film 95 and the third insulating film 22.

The first gate electrode 28 is electrically connected to the gate metal 72 via a contact hole provided in the interlayer insulating film 95. The source metal 70 and the first field plate electrode 24 are insulated from the first gate electrode 28 by the interlayer insulating film 95 and the third insulating film 22.

It should be noted that in regard to the electrical connection between the source metal 74 and the first field plate electrode 24, the electrical connection between the source metal 82 and the second field plate electrode 44, the electrical connection between the gate metal 84 and the second gate electrode 48, and the electrical connection between the source metal 86 and the second field plate electrode 44, the electrical connection can be similarly performed.

A plating layer 76, a plating layer 78, a plating layer 80, a plating layer 88, a plating layer 90, and a plating layer 92 are respectively provided on the source metal 70, the gate metal 72, the source metal 74, the source metal 82, the gate metal 84, and the source metal 86. The plating layer 76, the plating layer 78, the plating layer 80, the plating layer 88, the plating layer 90, and the plating layer 92 are respectively electrically connected to the source metal 70, the gate metal 72, the source metal 74, the source metal 82, the gate metal 84, and the source metal 86. The plating layer 76, the plating layer 78, the plating layer 80, the plating layer 88, the plating layer 90, and the plating layer 92 are provided to improve the strength of connection by solder, for example, to an eternal electric circuit, not shown.

The plating layer 76 is isolated from the plating layer 78 by an insulating film 94$b$. The plating layer 78 is isolated from the plating layer 80 by an insulating film 94$c$. The plating layer 88 is isolated from the plating layer 90 by an insulating film 94$f$. The plating layer 90 isolated from the plating layer 92 by an insulating film. 94$g$. The plating layer 80 is isolated from the plating layer 92 by an insulating film 94$j$. It should be noted that the plating layer 88 is isolated from the plating layer 76, and the plating layer 78 is isolated from the plating layer 90 similarly by the insulating film 94 as well.

Figure 9:
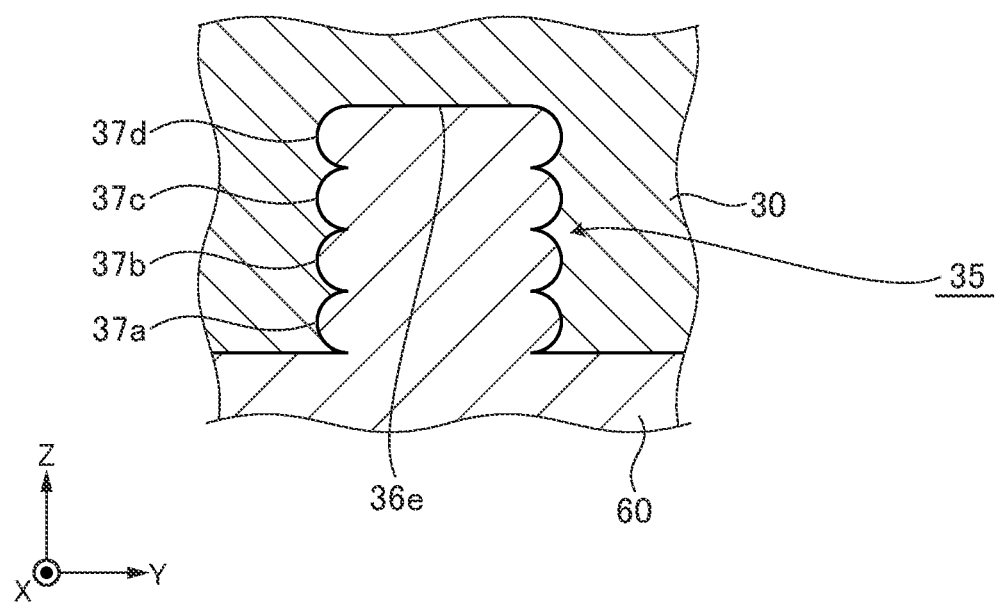
FIG. 9 is a schematic cross sectional view of the main components of the semiconductor device according to the first embodiment.

FIG. 9 is a schematic cross sectional view or the main components of the semiconductor device according to the first embodiment. FIG. 9 shows an example of the cross section of the groove 36. The groove 36 is preferably formed by plasma etching. Here, such plasma etching is performed by repeating isotropic etching using a F (fluorine) based radical, forming a protective film including a $CF_4$ (tetrafluoride carbon) based radical, and anisotropic etching using an F-based ion. By such plasma etching, a scallop 37 including a shell-like shape is formed on a side surface 35 of the groove 36. Specifically, a scallop 37$a$, a scallop 37$b$, a scallop 37$c$, and a scallop 37$d$ are formed. It should be noted that in regard to the groove 36 in the other drawings, the scallop 37 is omitted.

The substrate 30 is a silicon substrate, for example. However, the substrate 30 may be a silicon carbide (SiC) substrate, a gallium nitride (GaN) substrate, a gallium arsenide (GaAs) substrate, or any other substrate, for example.

In the case in which Si is used as a semiconductor material, arsenic (As), phosphorus (P), or antimony (Sb), for example, can be used as an n type impurity, and B (boron), for example, can be used as a p type impurity.

The first field plate electrode 24, the second field plate electrode 44, the first gate electrode 28, and the second gate electrode 48 include a conductive material such as polysilicon containing a conductive impurity, for example.

The drain electrode 60, the source metal 70, the gate metal 72, the source metal 74, the source metal 82, the gate metal 84, and the source metal 86 include a metal material such as Al (aluminum), Ag (silver), or Cu (copper), for example, and the drain electrode 60, the source metal 70, the gate metal 72, the source metal 74, the source metal 82, the gate metal 84, and the source metal 86 are formed by plating, for example.

Next, the operation and effect of the semiconductor device according to the present embodiment will be described.

Figure 10A:
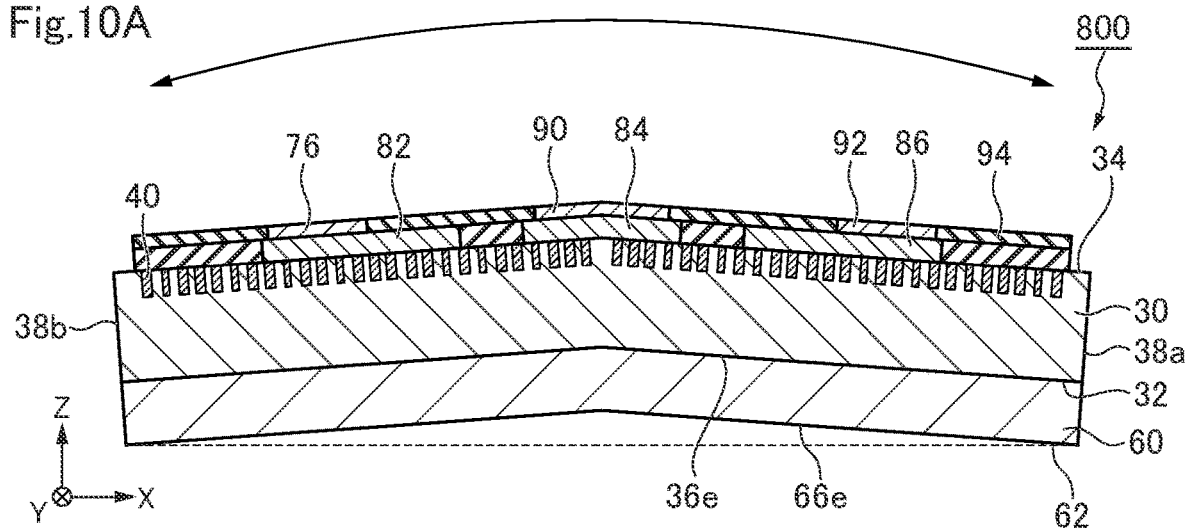
FIGS. 10A and 10B are schematic cross sectional views of a semiconductor device to he a comparative form to the first embodiment.
Figure 10B:
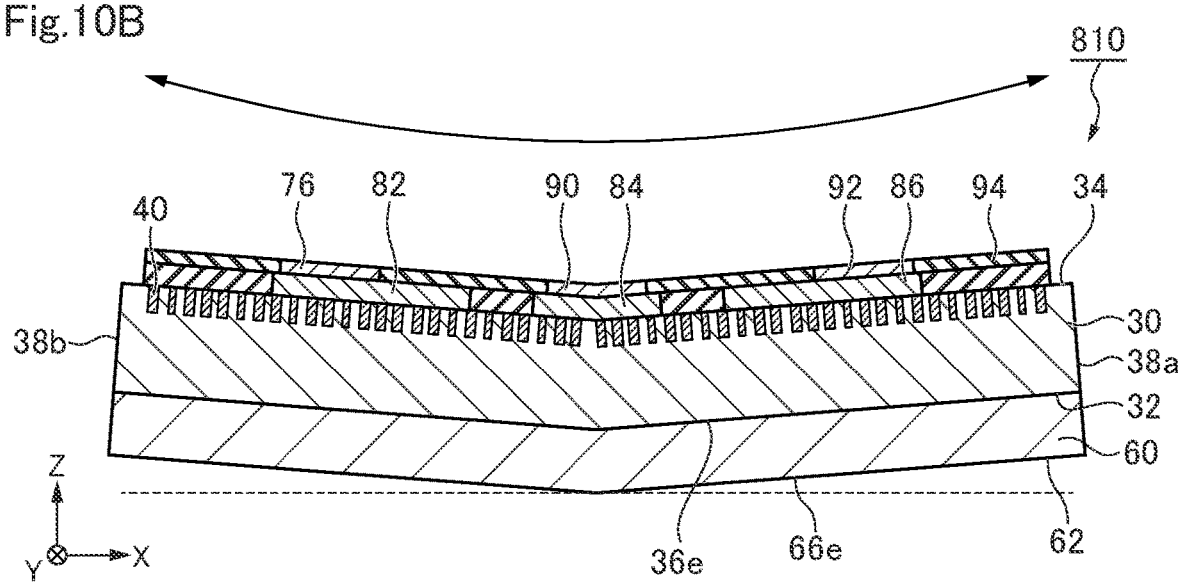

FIGS. 10A and 10B are schematic cross sectional views of a semiconductor device to be a comparative form to the first embodiment.

In the semiconductor device including the first transistor Tr1 and the second transistor Tr2 like the semiconductor device according to the present embodiment, reduction in the resistance of the drift layer 12 by thinning the substrate 30 is specifically demanded. Here, there is a problem in that thinning the substrate 30 warps the substrate 30 resulting in a failure of transportation in the manufacture processes of the semiconductor device, for example.

More specifically, in semiconductor devices in a trench gate structure having advantages in shrinking, for example, there is a problem in that the warpage of the substrate 30 is increased. Here, in regard to the forms of the warpage of the substrate 30, for example, there is the case in which the center part warps upward in the X-Z plane as shown FIG. 10A, and there is the case in which the center part warps downward in the X-Z plane as shown FIG. 10B. This can be understood that a large warp occurs in a plane (the X-Z plane) vertically intersecting with the direction in which the first trench 20 and the second trench 40 extend. However, the shapes of the first trench 20 and the second trench 40, the shapes or materials of the first gate electrode 28 and the second gate electrode 48, the shapes or materials of the first field plate electrode 24 and the second field plate electrode 44, the shape or the material of the drift region 12, the shapes or materials of the base region 14 and the source region 16, and the shapes or materials of the base region 54 and the source region 56 are directly linked to the properties of the MOSFET. Therefore, in order to suppress such warpage, it is difficult to change the shapes or materials.

Therefore, the semiconductor device 100 according to the present embodiment includes, on the first surface 32 of the substrate 30, the groove 36 including a length in the Y-direction intersecting with the X-direction, the Y-direction in parallel with the first surface 32, shorter than a length in the X-direction in parallel with the first surface 32. In the substrate 30, the first trench 20 and the second trench 40 extend in the Y-direction.

Accordingly, a possible occurrence of the warpage of the substrate 30 in the lane can be suppressed by the provision of the groove 36. The groove 36 is formed to thin a part of the substrate 30, and thus the resistance of the drift layer 12 can be reduced. Accordingly, a semiconductor device of a high yield can be provided.

Preferably, the groove 36 is formed by plasma etching, because the depth or pattern of the groove 36 to be formed can be easily changed suitable for the shape of the warpage of the substrate 30. In this case, the side surface 35 of the groove 36 is to include the scallop 37.

Preferably, the groove 36 does not penetrate the side surface 38 of the substrate 30. This is because when the groove 36 penetrates the side surface 38 of the substrate 30, the strength of the substrate 30 including such penetration becomes weak. With similar reasons, in the case in which a plurality of grooves 36 is provided, preferably, all the grooves 36 do not penetrate the side surface 38 of the substrate 30.

When the drain electrode 60 is formed on the first surface 32 of the substrate 30 where the groove 36 is formed, the groove 66 is formed below the groove 36 on the bottom surface of the drain electrode 60, the groove 66 including the length $L_4$ in the Y-direction shorter than the length $L_2$ in the X-direction. Here, $L<L_1$ and $L_4<L_7$, for example. The groove 66 is formed by tracing the shape of the groove 36 to the shape of the drain electrode 60 in forming the drain electrode 60.

According to the semiconductor device 100 of the present embodiment, a semiconductor device 100 of a high yield can be provided.

Second Embodiment

A semiconductor device according to the present embodiment is different from the semiconductor device according to the first embodiment in that a third groove is provided adjacent to a first groove, a third length of the third groove in the first direction is shorter than the first length of the first groove in the first direction, and the depth of the third groove is deeper than the depth of the first groove. Here, the description of the content duplicated with the first embodiment is omitted.

Figure 11A:
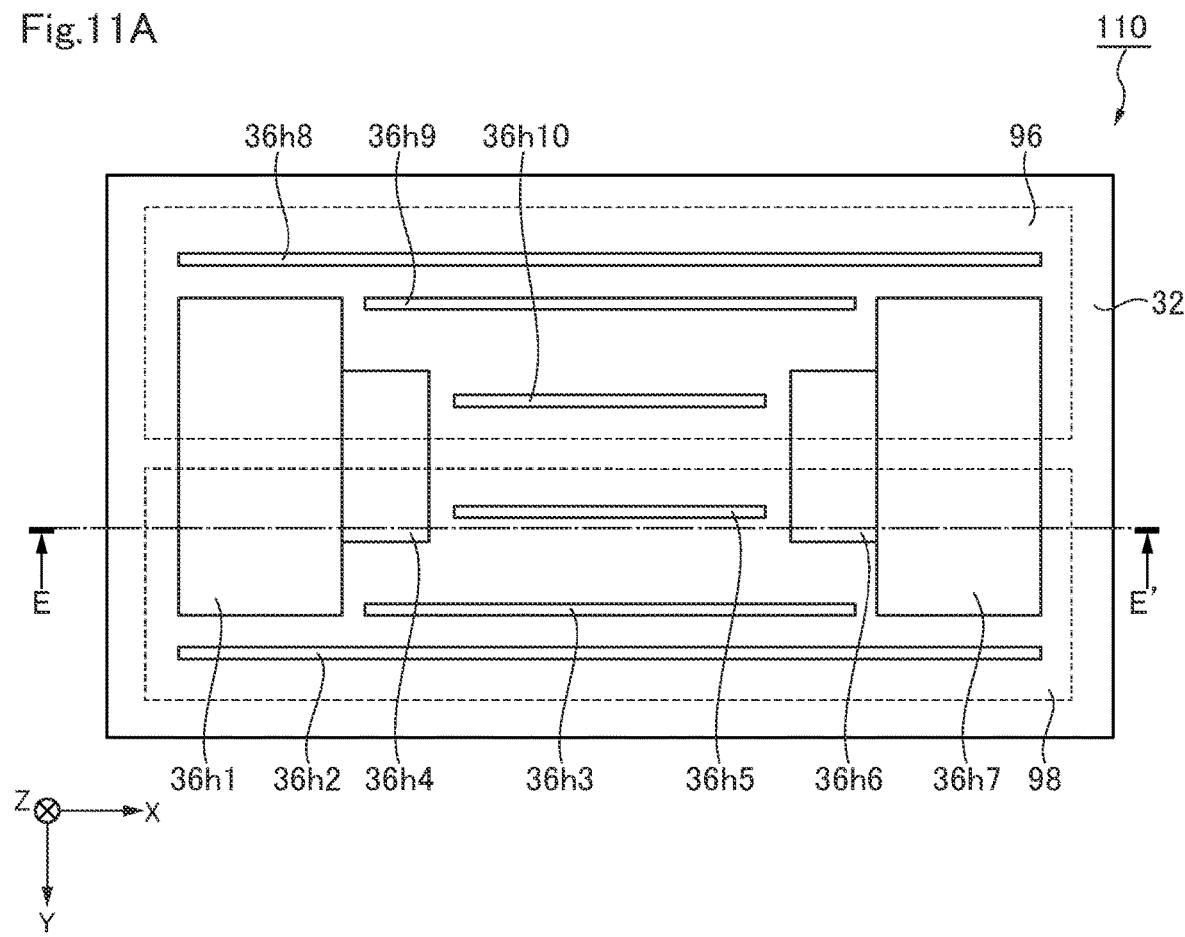
FIGS. 11A and 11B are schematic diagrams of the main components of a semiconductor device according to a second embodiment.
Figure 11B:
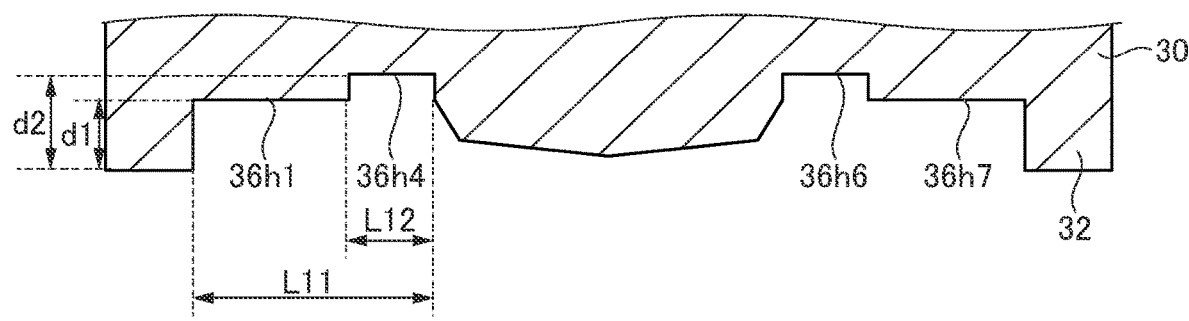

FIGS. 11A and 11B are schematic diagrams of a semiconductor device 110 according to the present embodiment. FIG. 11A is a schematic diagram showing a first surface 32 of a substrate 30 and a groove 36 formed on the first surface 32. FIG. 11B is a schematic cross sectional view of the substrate 30 and the groove 36 in a cross section taken along E-E' in FIG. 11A. In FIG. 11A, a groove $36h_1$ (an example of the first groove), a groove $36h_2$, a groove $36h_3$, a groove $36h_4$ (an example of a third groove), a groove $36h_5$ a groove $36h_6$, a groove $36h_7$, a groove $36h_2$, a groove $36h_9$, and a groove $36h_{10}$ are shown. The groove $36h_4$ is adjacent to the groove $36h_1$. As shown in FIG. 11B, a length $L_{12}$ of the groove $36h_4$ is shorter than a length $L_{11}$ of the groove $36h_1$. As shown in FIG. 11B, a depth $d_2$ of the groove $36h_4$ is deeper (longer) than a depth $d_1$ of the groove $36h_1$.

For example, adjacent to the groove 36d shown in FIG. 3C, a predetermined groove which is longer in length and deeper in depth than the groove 36d can be provided in such a case, the groove 36d in FIG. 3C is an example of the first groove of the present embodiment. Further, in such a case, the predetermined groove is an example of the third groove of the present embodiment.

FIGS. 12A to 12E are schematic cross sectional views showing the main part of the manufacturing process steps of the semiconductor device 110 according to the present embodiment. FIGS. 12A to 12E are schematic cross sectional views showing the main part of the manufacturing process steps of the groove 36 on the first surface 32 of the substrate 30.

Figure 12A:
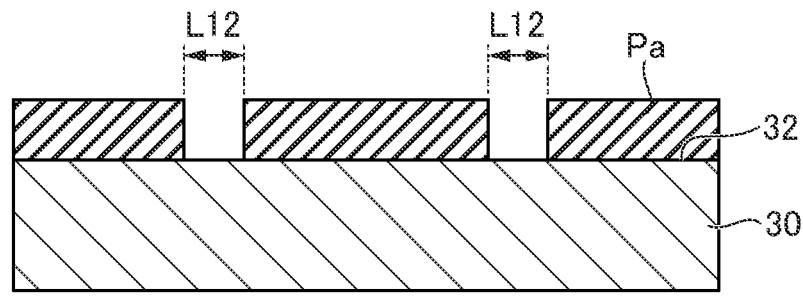
FIGS. 12A to 12E are schematic cross sectional views showing the main part of the manufacturing process steps of the semiconductor device according to the second embodiment.

First, on the first surface 32 of the substrate 30, a photoresist $P_a$ provided with the spacings of the length $L_{12}$ is formed (FIG. 12A).

Figure 12B:
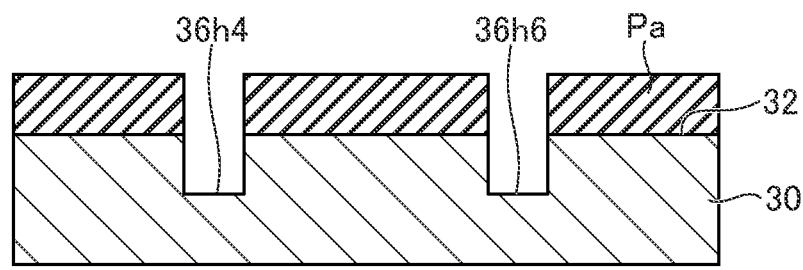
Figure 12C:
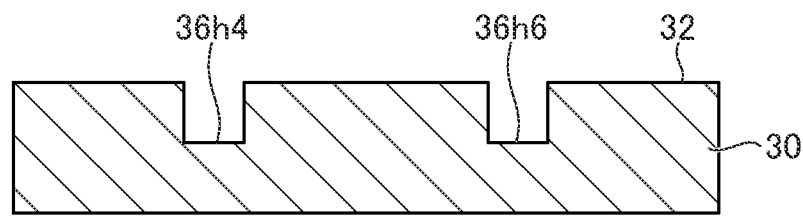

Subsequently, a part of the substrate 30 where the photoresist $P_a$ is not provided is removed by plasma etching, and the groove $36h_4$ and the groove $36h_6$ are formed (FIG. 12B). Subsequently, the photoresist $P_a$ is removed (FIG. 12C).

Figure 12D:
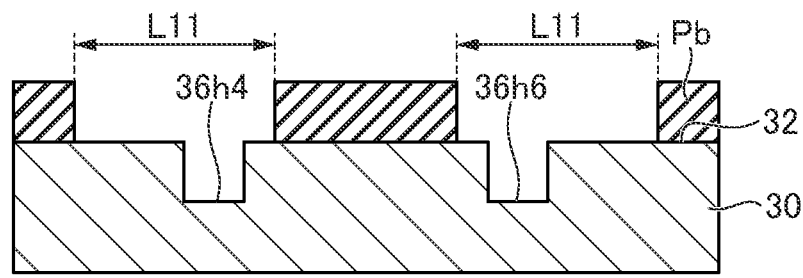

Subsequently, on the first surface 32 of the substrate 30 where the groove $36h_4$ and the groove $36h_6$ are not formed, a photoresist $P_b$ provided with an opening including the length $L_{11}$ in the X-direction is formed (FIG. 12D).

Figure 12E:
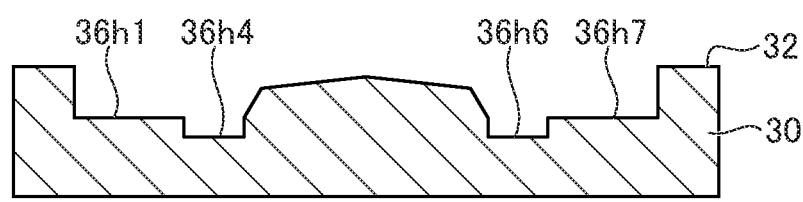

Subsequently, a part of the substrate 30 where the photoresist $P_a$ is not provided is removed by plasma etching, and the groove $36h_1$ and the groove $36h_7$ are formed. Subsequently, the photoresist $P_a$ is removed (FIG. 12E). As described above, the groove $36h_1$ and the groove $36h_4$ of the present embodiment can be formed.

In order to further suppress the warpage of the substrate 30, the manufacturing method of the present embodiment is combined, and thus the groove 36 in various shapes can be formed. For example, by providing the predetermined groove which is longer in length and deeper in depth than the groove 36d to be adjacent to the groove 36d shown in FIG. 30, the warpage of the substrate 30 can be further suppressed. Therefore, according to the semiconductor device 110 of the present embodiment, a semiconductor device of a higher yield can be provided.

Third Embodiment

A semiconductor device according to the present embodiment is different from the semiconductor devices according to the first and the second embodiments in that a first surface includes, between a first groove and the end part of a substrate in the second direction, a fourth groove including its fourth length in the second direction shorter than the second length of the first groove in the second direction. Here, the description of the content duplicated with the first and the second embodiments is omitted.

Figure 13:
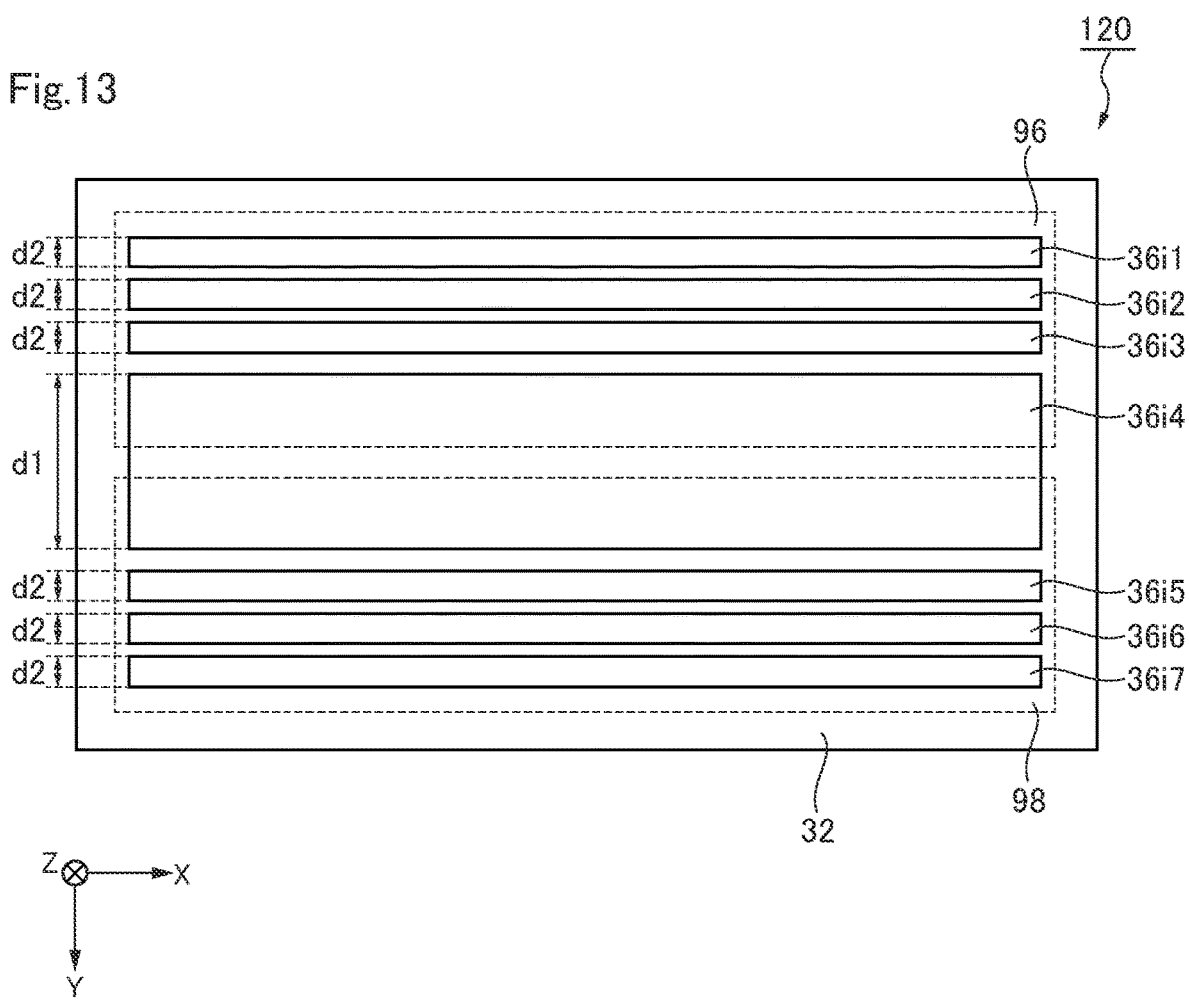
FIG. 13 is a schematic diagram of the main components of a semiconductor device according to a third embodiment.

FIG. 13 is a schematic diagram of a semiconductor device 120 according to the present embodiment. FIG. 13 is a schematic diagram showing a first surface 32 of a substrate 30 and a groove 36 formed on the first surface 32. In FIG. 13, a groove $36i_1$ (an example of a fourth groove), a groove $36i_2$ (an example of the fourth groove), a groove $36i_3$ (an example of the fourth groove), a groove $36i_4$ (an example of the first groove), a groove $36i_5$ (an example of the fourth groove), a groove $36i_6$ (an example of the fourth groove), and a groove $36i_7$ (an example of the fourth groove) are shown. The length of the groove $36i_1$, the groove $36i_2$, the groove $36i_3$, the groove $36i_5$ the groove $36i_6$ and the groove $36i_7$ in the Y direction is $d_2$, which is shorter than the length of the groove $36i_4$ in the Y direction.

For example, the lengths of the groove 36a (an example of the fourth groove), the groove 36h (an example of the fourth groove), the groove 36c (an example of the fourth groove), the groove 36e (an example of the fourth groove), the groove 36f (an example of the fourth groove), and the groove 36e (an example of the fourth groove) shown in FIGS. 3A to 3C in the Y-direction can be made shorter than the length of the groove 36d (an example of the first groove) in the Y-direction.

The length of the groove $36i_4$ in the Y-direction at the center part of the first surface 32 is made longer than the other grooves, and thus in the case in which a warpage at the center part of the substrate 30 is stronger, such a warpage can be suppressed.

According to the semiconductor device 120 of the present embodiment, a semiconductor device 120 of a high yield can be provided.

Fourth Embodiment

A semiconductor device according to the present embodiment is different from the semiconductor devices according to the first to the third embodiments in that a first surface includes, between a first groove and the end part of a substrate in the second direction, a fifth groove including its fifth length in the second direction longer than the second length of the first groove in the second direction. Here, the description of the content duplicated with the first to the third embodiments is omitted.

Figure 14:
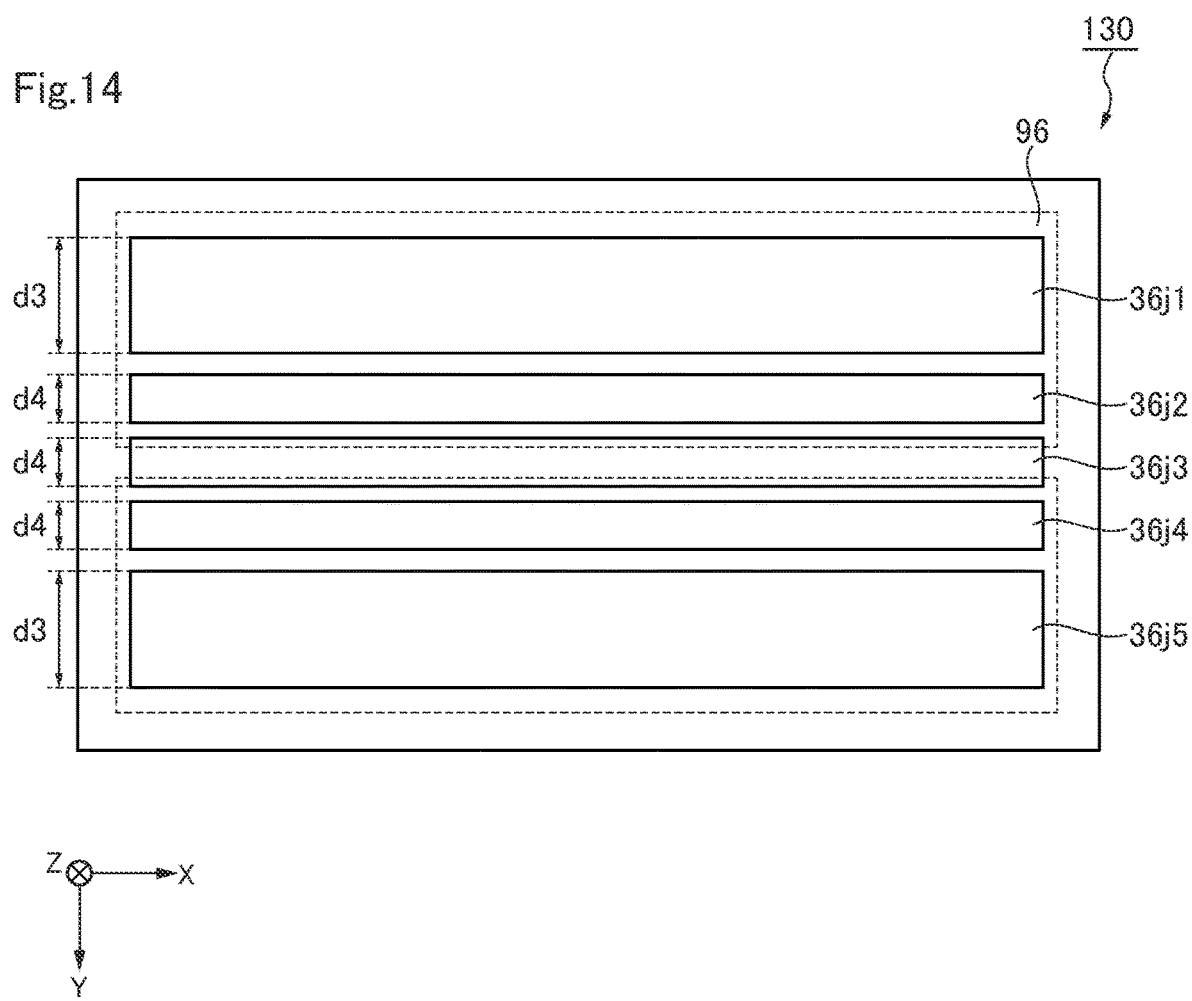
FIG. 14 is a schematic diagram of the main components of a semiconductor device according to a fourth embodiment.

FIG. 14 is a schematic diagram of a semiconductor device 130 according to the present embodiment. FIG. 14 is a schematic diagram showing a first surface 32 of a substrate 30 and a groove 36 formed on the first surface 32. In FIG. 14, a groove $36j_1$ (an example of a fifth groove), a groove $36j_2$ (an example of the first groove), a groove $36j_3$ (an example of the first groove), a groove $36j_4$ (an example of the first groove), and a groove $36j_5$ (an example of the fifth groove) are shown. The lengths of the groove $36j_1$ and the groove $36j_5$ in the Y-direction are $d_3$, and the length $d_3$ is longer than lengths $d_4$ of the groove $36j_2$, the groove $36j_3$, and the groove $36j_4$ in the Y-direction.

The length of the groove 36a, the groove 36b, the groove 36c, the groove 36e, the groove 36f and the groove 36g shown in FIGS. 3A to 3C in the Y-direction is shorter than the length of the groove 36d in the Y-direction shown in FIG. 3C. However, the length of the groove 36a, the groove 36b, the groove 36c, the groove 36e, the groove 36f and the groove 36g can be made longer than the length of the groove 36d in the Y-direction. In this case, the groove 36a, the groove 36b, the groove 36c, the groove 36e, the groove 36f and the groove 36g are examples of the fifth groove of the present embodiment. Further, in this case, the groove 36d is an example of the first groove of the present embodiment.

The lengths of the groove $36j_1$ and the groove $36j_5$ at the end portions of the first surface 32 n the Y-direction are made longer than the lengths of the groove $36j_2$, the groove $36j_3$, and the groove $36j_4$ in the Y-direction, and thus in the case in which a warpage at the end part of the substrate 30 is stronger, such a warpage can be suppressed.

According to the semiconductor device 130 of the present embodiment, semiconductor device 130 of a high yield can be provided.

Fifth Embodiment

A semiconductor device according to the present embodiment is different from the semiconductor devices according to the first to the fourth embodiments in that a first surface includes a plurality of sixth grooves arranged in the first direction to a first groove and a plurality of seventh grooves arranged in the second direction to the first groove and the sixth grooves respectively. Here, the description of the content duplicated with the first to the fourth embodiments omitted.

Figure 15:
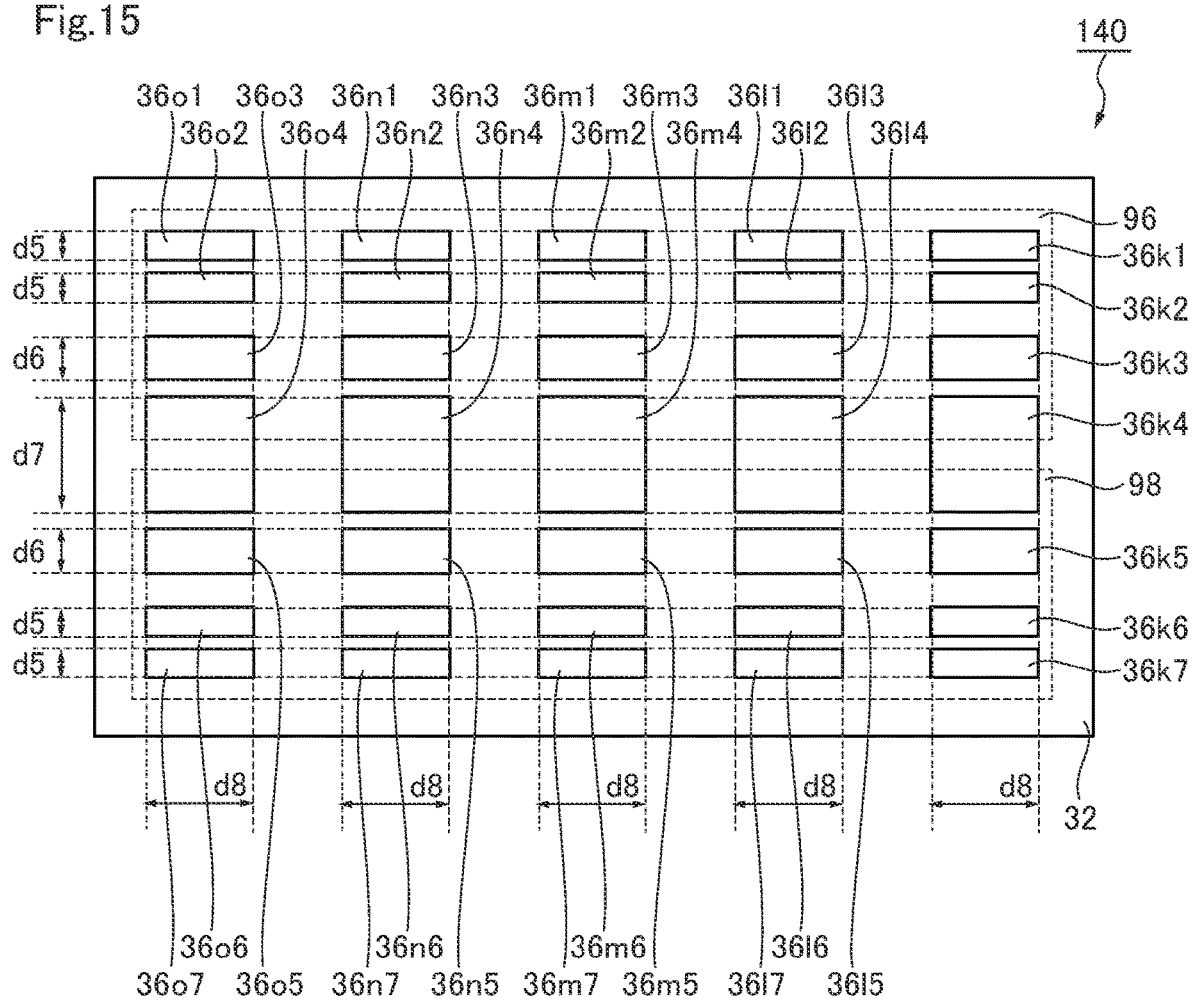
FIG. 15 is a schematic diagram of the main components of a semiconductor device according to a fifth embodiment.

FIG. 15 is a schematic diagram of a semiconductor device 140 according to the present embodiment. FIG. 15 is a schematic diagram showing a first surface 32 of a substrate 30 and a groove 36 formed on the first surface 32. In FIG. 15, as the groove 36, a groove $36o_1$, a groove $36o_2$, a groove $36o_3$, a groove $36o_4$, a groove $36o_1$, a groove $36o_6$, a groove $36o_7$, a groove $36n_1$, a groove $36n_2$, a groove $36n_3$, a groove $36n_4$, a groove $36n_5$, a groove $36n_6$, a groove $36n_7$, a groove $36m_5$, a groove $36m_2$, a groove $36m_3$, a groove $36m_4$, a groove $36m_5$, a groove $36m_6$, a groove $36m_7$, a groove $36l_1$, a groove $36l_2$, a groove $36l_3$, a groove $36l_4$, a groove $36l_5$, a groove $36l_5$, a groove $36l_7$, a groove $36k_i$, a groove $36k_2$, a groove $36k_3$, a groove $36k_4$, a groove $36k_5$, a groove $36k_6$, and a groove $36k_7$ are shown.

To the groove $36m_l$ (an example of the first groove), the groove $36o_1$ the groove $36n_1$, the groove $36l_1$, and the groove $36k_5$ (an example of sixth (rooves) are arranged in the X-direction. To the groove $36o_1$, the groove $36o_3$, the groove $36o_4$, the groove $36o_5$, the groove $36o_6$, and the groove $36o_7$ (an example of a seventh grooves) are arranged in the Y-direction. To the groove $36n_1$, the groove $36n_2$, the groove $36n_3$, the groove $36n_4$ the groove $36n_5$, the groove $36n_6$, and the groove $36n_7$ (an example of the seventh grooves) are arranged in the Y-direction. To the groove $36l_1$, the groove $36l_2$, the groove $36l_3$, the groove $36l_4$, the groove $36l_5$, the groove $36l_6$, and the groove $36l_7$ (an example of the seventh grooves) are arranged in the Y-direction. To the groove $36k_1$, the groove $36k_2$ the groove $36k_5$, the groove $36k_4$, the groove $36k_5$, the groove $36k_6$, and the groove $36k_7$ (an example of the seventh grooves) are arranged in the Y-direction.

The width of the groove $36m_4$ in the Y-direction is $d_7$. The widths of the groove $36m_3$ and the groove $36m_5$ in the Y-direction are $d_6$, and $d_6<d_7$. The widths of the groove $36m_1$, the groove $36m_2$ the groove $36m_6$, and the groove $36m_7$ in the Y-direction are $d_5$, and $d_5<d_6$. On the other hand, the widths of the groove $36m_1$, the groove $36m_2$ the groove $36m_3$, the groove $36m_4$, the groove $36m_5$, the groove $36m_6$, and the groove $36m_7$ in the X-direction are $d_8$, and the widths are all equal. The groove 36 of the present embodiment includes such grooves, the groove $36m_1$, the groove $36m_2$, the groove $36m_3$, the groove $36m_4$, the groove $36m_5$, the groove $36m_6$, and the groove $36m_7$, are arranged in the X-direction.

For example, the groove 36a, the groove 36b, the groove 36c, the groove 36d, the groove 36e, the groove 36f, and the groove 36g shown in FIGS. 3A to 3C are divided into five parts in the X-direction, the widths in the Y-direction are changed, and thus the groove 36 shown in FIG. 15 can be obtained.

In the case in which the substrate 30 is twisted overall, the disposition of the groove 36 in the semiconductor device 140 according to the present embodiment can suppress such a twist.

According to the semiconductor device 140 of the present embodiment, a semiconductor 140 of a high yield can be provided.

Sixth Embodiment

A semiconductor device according to the present embodiment is different from the semiconductor device according to the first to the fifth embodiments in that grooves in different shapes are disposed below a plating layer 76, below a plating layer 80, below a plating layer 88, and below a plating layer 92. Here, the description of the content duplicated with the first to the fifth embodiments is omitted.

Figure 16:
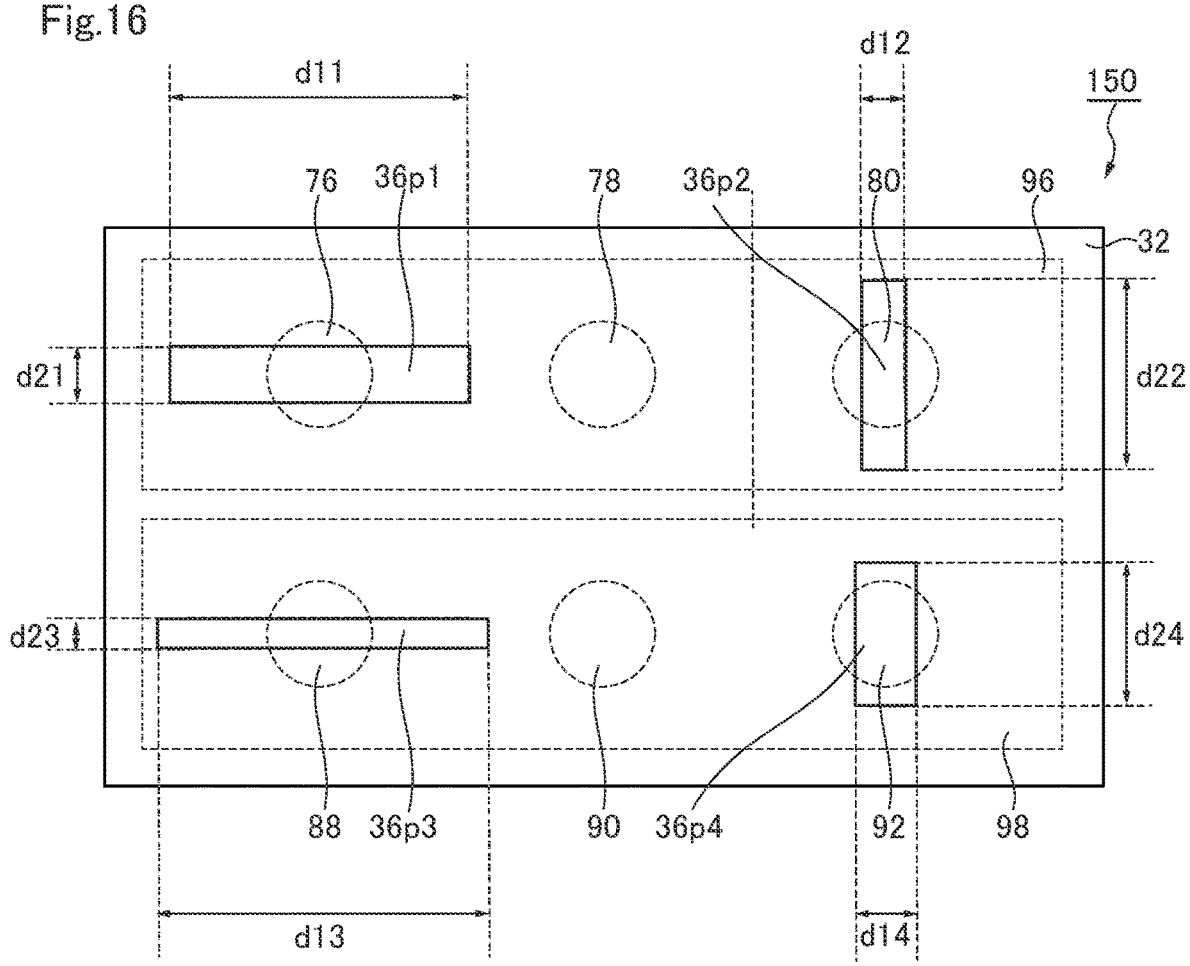
FIG. 16 is a schematic diagram of the main components of a semiconductor device according to a sixth embodiment.

FIG. 16 is a schematic diagram of a semiconductor device 150 according to the present embodiment. FIG. 16 is a schematic diagram showing a first surface 32 of a substrate 30 and a groove 36 formed on the first surface 32. The semiconductor device 150 according to the present embodiment further includes the plating layer 76 (an example of a fourth electrode) provided on a second surface 34 on the first region 96, the plating layer 76 being electrically connected to a source region 16 (an example of the second semiconductor region), the plating layer 80 (an example of a fifth electrode) provided on the second surface 34 on the first region 96, the plating layer 80 being is electrically connected to the source region 16 (an example of the second semiconductor region), a plating layer 78 (an example of the sixth electrode) provided on the second surface 34 between the plating layer 76 (an example of the fourth electrode) and the plating layer 80 (an example of the fifth electrode), the plating layer 78 being electrically connected to a first gate electrode 28 (an example of the second electrode), the plating layer 88 (an example of a seventh electrode) provided on the second surface 34 on a second region 98, the plating layer 88 being electrically connected to a source region 56 (an example of the fourth semiconductor region), the plating layer 92 (an example of the eighth electrode) provided on the second surface 34 on the second region 98, the plating layer 92 being electrically connected to the source region 56 (an example of the fourth semiconductor region), and a plating layer 90 (an example of a ninth electrode) provided on the second surface 34 between the plating layer 88 (an example of the seventh electrode) and the plating layer 92 (an example of the eighth electrode), the plating layer 90 being electrically connected to a second gate electrode 48 (an example of the third electrode). The first surface 32 further includes a groove $36p_1$ (an example of an eighth groove) provided below the plating layer 76 (an example of the fourth electrode), a groove $36p_2$ (an example of a ninth groove) provided below the plating layer 80 (an example of the fifth electrode), a groove $36p_3$ (an example of a tenth groove) provided below the plating layer 88 (an example of the seventh electrode), and a groove $36p_4$ (an example of an eleventh groove) provided below the plating layer 92 (an example of the eighth electrode.).

The shapes of the groove $36p_2$, the groove $36p_2$, the groove $36p_3$, and the groove $36p_4$ are different from each other. Specifically, lengths $d_{11}$, $d_{12}$, $d_{13}$, and $d_{14}$ of the groove $36p_1$, the groove $36p_2$, the groove $36p_3$, and the groove $36p_4$ in the X-direction are different from each other. Lengths $d_{21}$, $d_{22}$, $d_{23}$, and $d_{24}$ of the groove $36p_1$, the groove $36p_2$, the groove $36p_3$, and the groove $36p_4$ in the Y-direction are different from each other. It should be noted that differences in the shapes of the groove $36p_1$, the groove $36p_2$, the groove $36p_3$, and the groove $36p_4$ are, of course, not limited to the shapes described above.

In the case in which the substrate 30 includes a complicated warpage, the shape of the groove 36 is changed as described above, and thus warpage can be suppressed.

According to the semiconductor device 150 of the present embodiment, a semiconductor device 150 of a high yield can be provided.

While certain embodiments have been described, these embodiments have been presented by way of example only, and are not intended to limit the scope of the inventions. Indeed, the semiconductor device described herein may be embodied is a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first electrode; and
   a substrate including a first surface in contact with the first electrode and a second surface provided opposite to the first surface, the first surface including a first groove including a first length and a second length shorter than the first length, the first length in a first direction parallel to the first surface, the second length in a second direction parallel to the first surface, the second direction intersecting with the first direction, wherein
   the substrate includes
   a semiconductor layer having a first conductive type,
   a first semiconductor region provided between the semiconductor layer and the second surface, the first semiconductor region having second conductive type,
   a second semiconductor region provided between the first semiconductor region and the second surface, the second semiconductor region having an impurity concentration of the first conductive type higher than an impurity concentration of the semiconductor layer, and
   a second electrode provided in a first trench, the second electrode being provided opposite to the first semiconductor region via a first insulating film, the first trench reaching the semiconductor layer from the second surface, the first trench extending in the second direction,
   wherein the first electrode includes a second groove, and the second groove overlaps with the first groove in a third direction intersecting with the first direction and the second direction.

2. The semiconductor device according to claim 1, wherein the first groove does not penetrate a side surface of the substrate.

3. The semiconductor device according to claim 1, wherein in the second direction, the first surface includes a fourth groove provided between the first groove and an end part of the substrate, and the fourth groove includes a fourth length in the second direction shorter than the second length of the first groove.

4. The semiconductor device according to claim 1, wherein in the second direction, the first surface includes a fifth groove provided between the first groove and an end part of the substrate, and the fifth groove includes a fifth length in the second direction longer than the second length of the first groove.

5. The semiconductor device according to claim 1, wherein the first surface includes
 a plurality of sixth grooves arranged in the first direction to the first groove, and
 a plurality of seventh grooves arranged in the second direction to the first groove and the sixth grooves, respectively.

6. A semiconductor device comprising:
 a first electrode; and
 a substrate including a first surface in contact with the first electrode and a second surface provided opposite to the first surface, the first surface including a first groove including a first length and a second length shorter than the first length, the first length in a first direction parallel to the first surface, the second length in a second direction parallel to the first surface, the second direction intersecting with the first direction, wherein
 the substrate includes
 a semiconductor layer having a first conductive type,
 a first semiconductor region provided between the semiconductor layer and the second surface, the first semiconductor region having a second conductive type,
 a second semiconductor region provided between the first semiconductor region and the second surface, the second semiconductor region having an impurity concentration of the first conductive type higher than an impurity concentration of the semiconductor layer, and
 a second electrode provided in a first trench, the second electrode being provided opposite to the first semiconductor region via a first insulating film, the first trench reaching the semiconductor layer from the second surface, the first trench extending in the second direction,
 wherein a third groove is provided adjacent to the first groove, and a third length of the third groove in the first direction is shorter than the first length of the first groove in the first direction,
 and wherein in the third direction, a depth of the third groove is deeper than a depth of the first groove.

7. The semiconductor device according to claim 6, wherein the first groove does not penetrate a side surface of the substrate.

8. The semiconductor device according to claim 6, wherein in the second direction, the first surface includes a fourth groove provided between the first groove and an end part of the substrate, and the fourth groove includes a fourth length in the second direction shorter than the second length of the first groove.

9. The semiconductor device according to claim 6, wherein in the second direction, the first surface includes a fifth groove provided between the first groove and an end part of the substrate, and the fifth groove includes a fifth length in the second direction longer than the second length of the first groove.

10. The semiconductor device according to claim 6, wherein the first surface includes
 a plurality of sixth grooves arranged in the first direction to the first groove, and
 a plurality of seventh grooves arranged in the second direction to the first groove and the sixth grooves, respectively.

11. A semiconductor device comprising:
 a first electrode; and
 a substrate including a first surface in contact with the first electrode and a second surface provided opposite to the first surface, the first surface including a first groove including a first length and a second length shorter than the first length, the first length in a first direction parallel to the first surface, the second length in a second direction parallel to the first surface, the second direction intersecting with the first direction, wherein
 the substrate includes
 a semiconductor layer having first conductive type,
 a first semiconductor region provided between the semiconductor layer and the second surface, the first semiconductor region having a second conductive type,
 a second semiconductor region provided between the first semiconductor region and the second surface, the second semiconductor region having an impurity concentration of the first conductive type higher than an impurity concentration of the semiconductor layer,
 a second electrode provided in a first trench, the second electrode being provided opposite to the first semiconductor region via a first insulating film, the first trench reaching the semiconductor layer from the second surface, the first trench extending in the second direction,
 a third semiconductor region provided between the semiconductor layer and the second surface, the third semiconductor region having a second conductive type,
 a fourth semiconductor region provided between the third semiconductor region and the second surface, the fourth semiconductor region having an impurity concentration of the first conductive type higher than an impurity concentration of the semiconductor layer, and
 a third electrode provided in a second trench, the third electrode being provided opposite to the third semiconductor region via a second insulating film, the second trench reaching the semiconductor layer from the second surface, the second trench extending in the second direction,
 the substrate includes a first region and a second region, the first region includes the first semiconductor region, the second semiconductor region, and the second electrode, the second region is provided adjacent to the first region in the second direction, and the second region includes the third semiconductor region, the fourth semiconductor region, and the third electrode, and
 the first groove extends from the first region to the second region.

12. The semiconductor device according to claim 11, wherein a third groove is provided adjacent to the first groove, and a third length of the third groove in the first direction is shorter than the first length of the first groove in the first direction,
 and wherein in the third direction, a depth of the third groove is deeper than a depth of the first groove.

13. The semiconductor device according to claim 11, wherein in the second direction, the first surface includes a fourth groove provided between the first groove and an end part of the substrate, and the fourth groove includes a fourth length in the second direction shorter than the second length of the first groove.

14. The semiconductor device according to claim 11,
wherein in the second direction, the first surface includes
a fifth groove provided between the first groove and an end part of the substrate, and the fifth groove includes a fifth length in the second direction longer than the second length of the first groove.

15. The semiconductor device according to claim 11,
wherein the first surface includes
a plurality of sixth grooves arranged in the first direction to the first groove, and
a plurality of seventh grooves arranged in the second direction to the first groove and the sixth grooves, respectively.

\* \* \* \* \*